ized Patent No.: US 12,376,491 B2

(12) United States Patent
Roh et al.

(10) Patent No.: US 12,376,491 B2
(45) Date of Patent: Jul. 29, 2025

(54) THERMOELECTRIC ELEMENT

(71) Applicant: LG INNOTEK CO., LTD., Seoul (KR)

(72) Inventors: Myoung Lae Roh, Seoul (KR); Tae Su Yang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 205 days.

(21) Appl. No.: 18/027,180

(22) PCT Filed: Sep. 17, 2021

(86) PCT No.: PCT/KR2021/012805
§ 371 (c)(1),
(2) Date: Mar. 20, 2023

(87) PCT Pub. No.: WO2022/060165
PCT Pub. Date: Mar. 24, 2022

(65) Prior Publication Data
US 2023/0345835 A1    Oct. 26, 2023

(30) Foreign Application Priority Data

Sep. 21, 2020   (KR) .................. 10-2020-0121414

(51) Int. Cl.
*H10N 10/817*    (2023.01)
(52) U.S. Cl.
CPC ................. *H10N 10/817* (2023.02)
(58) Field of Classification Search
CPC .................................................. H10N 10/817
See application file for complete search history.

(56) References Cited

U.S. PATENT DOCUMENTS 9,065,016 B2    6/2015  Peter et al.
2019/0148617 A1*  5/2019  Yi ...................... H01L 23/373
                                                                  136/205

FOREIGN PATENT DOCUMENTS

| JP | 07-022657 | 1/1995 |
| JP | 2008-270410 | 11/2008 |
| KR | 10-2018-0048260 | 5/2018 |
| KR | 10-2019-0061843 | 6/2019 |

OTHER PUBLICATIONS

Liu et al., "Theoretical analysis of performance of variable cross-section thermoelectric generators: Effects of shape factor and thermal boundary conditions", Energy 201 (2020) 117660. (Year: 2020).*
International Search Report dated Dec. 16, 2021 issued in Application No. PCT/KR2021/012805.

* cited by examiner

*Primary Examiner* — Tae-Sik Kang
(74) *Attorney, Agent, or Firm* — KED & ASSOCIATES, LLP

(57) ABSTRACT

A thermoelectric element according to an embodiment of the present invention comprises: a first electrode; a semiconductor structure disposed on the first electrode; and a second electrode disposed on the semiconductor structure, wherein the bottom surface of the second electrode includes an overlap area vertically overlapping the first electrode, the semiconductor structure includes a top surface opposite to the second electrode, and the center of the top surface of the semiconductor structure is arranged to be offset from the center of the overlap area.

8 Claims, 12 Drawing Sheets

(a)

(b)

THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2021/012805, filed Sep. 17, 2021, which claims priority to Korean Patent Application No. 10-2020-0121414, filed Sep. 21, 2020, whose entire disclosures are hereby incorporated by reference.

TECHNICAL FIELD

The present invention relates to a thermoelectric element, and more particularly, to a structure of an electrode part of the thermoelectric element.

BACKGROUND ART

A thermoelectric phenomenon is a phenomenon occurring due to movement of electrons and holes in a material and means direct energy conversion between heat and electricity.

A thermoelectric element is a generic term for elements in which the thermoelectric phenomenon is used and has a structure in which P-type thermoelectric materials and N-type thermoelectric materials are bonded between metal electrodes to form PN junction pairs.

The thermoelectric elements may be classified into elements which use a change in electrical resistance according to a change in temperature, elements which use the Seebeck effect in which an electromotive force is generated due to a difference in temperature, and elements which use the Peltier effect in which heat absorption or heating occurs due to a current.

The thermoelectric elements are being variously applied to home appliances, electronic components, communication components, and the like. For example, the thermoelectric elements may be applied to cooling devices, heating devices, power generating apparatuses, and the like. Accordingly, the demand for thermoelectric performance of the thermoelectric elements is gradually increasing.

The thermoelectric element includes a substrate, electrodes, and thermoelectric legs, wherein a plurality of thermoelectric legs are disposed in an array form between an upper substrate and a lower substrate, a plurality of upper electrodes are disposed between the plurality of thermoelectric legs and an upper substrate, and a plurality of lower electrodes are disposed between the plurality of the thermoelectric legs and a lower substrate.

In general, the upper substrate and the lower substrate are made of a rigid material and are disposed parallel to each other, and the upper electrode and the lower electrode are disposed so as to be overlapped with each other. Accordingly, the degree of freedom of the shape of an application to which the thermoelectric element is applied may be limited.

DISCLOSURE

Technical Problem

A technical problem to be achieved by the present invention is to provide a structure of an electrode part of a thermoelectric module.

Technical Solution

A thermoelectric element according to an embodiment of the present invention may include a first electrode; a semiconductor structure disposed on the first electrode; and a second electrode disposed on the semiconductor structure, wherein a lower surface of the second electrode includes an overlapping region which is vertically overlapped with the first electrode, the semiconductor structure includes an upper surface facing the second electrode, and a center of the upper surface of the semiconductor structure is disposed so as to be offset from a center of the overlapping region.

The first electrode and the second electrode may have a length in which a length in a first direction perpendicular to a direction from the first electrode toward the second electrode is longer than a length in a second direction perpendicular to the direction from the first electrode toward the second electrode and the first direction, respectively, and each of two side surface of the first electrode parallel to the first direction may be disposed so as not to be vertically overlapped with each of two side surfaces of the second electrode parallel to the first direction.

A first-first side surface, which is one of the two side surfaces of the first electrodes parallel to the first direction, may include a region which is vertically overlapped with the second electrode, and a first-second side surface, which is the other side surface, may not be vertically overlapped with the second electrode and a second-first side surface, which is one side surface of the two side surfaces of the second electrode parallel to the first direction, may not be vertically overlapped with the first electrode, and a second-second side surface, which is the other side surface, may include a region which is vertically overlapped with the first electrode.

A point where a first-third side surface, which is one of two side surfaces of the first electrode parallel to the second direction, meets the first-first side surface may be vertically overlapped with the second electrode, and a point where the first-third side surface meets the first-second side surface may not be vertically overlapped with the second electrode, and a point where a second-third side surface, which is one of two side surfaces of the second electrode parallel to the second direction, meets the second-first side surface may not be vertically overlapped with the first electrode, and a point where the second-third side surface meets the second-second side surface may be vertically overlapped with the first electrode, At least one of the shortest distance between the semiconductor structure and the first-first side surface, the shortest distance between the semiconductor structure and the second-second side surface, the shortest distance between the semiconductor structure and the first-third side surface of the first electrode and the shortest distance between the semiconductor structure and the second-third side surface may be 100 μm or more, and may be less than or equal to the width of the semiconductor structure in the first direction or the second direction.

At least one of a distance between the first-first side surface and the second-first side surface in the second direction and a distance between the first-second side surface and the second-second side surface in the second direction may be 100 μm or more and 2 mm or less.

The thermoelectric element may further include a first substrate disposed on lower surfaces of the first electrode, and the first substrate may be cut parallel to at least one of two side surfaces of the first electrode parallel to the first direction or to at least one of two side surfaces of the first electrode parallel to the second direction.

The thermoelectric element may further include a second substrate disposed on upper surfaces of the second electrode, and the second substrate may be cut parallel to at least one of two side surfaces of the second electrode parallel to the first direction or to at least one of two side surfaces of the second electrode parallel to the second direction.

The thermoelectric element may further include a first substrate disposed on lower surfaces of the first electrode; and a second substrate disposed on upper surfaces of the second electrode, wherein the first substrate may include a disconnection region extending parallel to at least one of two side surfaces of the first electrode parallel to the first direction, the second substrate may include a disconnection region extending parallel to at least one of the two side surfaces of the second electrode parallel to the first direction, and at least a portion of the disconnection region of the first substrate may be vertically overlapped with the disconnection region of the second substrate.

A width of the disconnection region of the first substrate in the second direction may be different from a width of the disconnection region of the second substrate in the second direction.

The thermoelectric element may further include a first substrate disposed on lower surfaces of the first electrode; and a second substrate disposed on upper surfaces of the second electrode, wherein the first substrate may include a disconnection region extending parallel to at least one of two side surfaces of the first electrode parallel to the second direction, the second substrate may include a disconnection region extending parallel to at least one of the two side surfaces of the second electrode parallel to the second direction, and at least a portion of the disconnection region of the first substrate may not be vertically overlapped with the disconnection region of the second substrate.

An elastic layer may be disposed on at least one of the disconnection region of the first substrate and the disconnection region of the second substrate.

A thermoelectric element according to an embodiment of the present invention may include a first substrate; a first electrode array disposed on the first substrate; a semiconductor structure array disposed on the first electrode array; a second electrode array disposed on the semiconductor structure array; and a second substrate disposed on the second electrode array, wherein the first electrode array may include a plurality of first electrodes disposed so as to be spaced apart from each other along a first direction perpendicular to a direction from the first substrate toward the second substrate and a second direction perpendicular to the direction from the first substrate toward the second substrate and the first direction, the second electrode array may include a plurality of second electrodes disposed so as to be spaced apart from each other along the first direction and the second direction, a lower surface of one of the plurality of second electrodes may include an overlapping region which is vertically overlapped with a lower surface of one of the plurality of first electrodes, the semiconductor structure array may include an upper surface facing the second electrode array, and a center of the upper surface of one of the semiconductor structure arrays is offset from a center of the overlapping region.

Each of the plurality of first electrodes and the plurality of second electrodes may have a length in the first direction longer than a length in the second direction, and two side surfaces parallel to the first direction of each first electrode may be disposed so as not to be vertically overlapped with two side surfaces parallel to the first direction of each second electrode.

One side surface of the two side surfaces of each second electrode parallel to the first direction may not be vertically overlapped with each first electrode, and the other side surface may include a region which is vertically overlapped with the each first electrodes.

Each of the two side surfaces of at least one of the plurality of first electrodes parallel to the first direction may include a region which is vertically overlapped with the plurality of second electrodes and a region which is not vertically overlapped with the plurality of second electrodes.

At least one of the plurality of first electrodes may include a first region which is vertically overlapped with one second electrode among the plurality of second electrodes and a second region which is vertically overlapped with another second electrode adjacent to the one second electrode, at least one of the plurality of first electrodes may include a first-first side surface and a first-second side surface parallel to the first direction and a first-third side surface and a first-fourth side surface parallel to the second direction, and a point where the first-first side surface meets the first-third side surface and a point where the first-second side surface meets the first-fourth side surface may not be vertically overlapped with the plurality of second electrodes, and a point where the first-first side surface meets the first-fourth side surface and a point where the first-second side surface meets the first-third side surface may be vertically overlapped with the plurality of second electrodes.

A separation distance between two first electrodes disposed adjacent to each other in the second direction may be the same as a separation distance between two second electrodes disposed adjacent to each other in the second direction.

The separation distance between two first electrodes disposed adjacent to each other in the second direction may be different from the separation distance between two second electrodes disposed adjacent to each other in the second direction.

The first substrate may include at least one disconnection region disconnected between the plurality of first electrodes, the second substrate may include at least one disconnection region disconnected between the plurality of second electrodes, and an elastic layer may be disposed in the disconnection region of the first substrate and the disconnection region of the second substrate.

Advantageous Effects

According to an embodiment of the present invention, the degree of freedom in a shape of a thermoelectric element may be improved, and a flexible or stretchable thermoelectric element may be obtained.

In addition, according to an embodiment of the present invention, the reliability, durability, and power generation performance of the thermoelectric element may be optimized by designing areas of the high-temperature part substrate and the low-temperature part substrate differently.

BEST MODE

Hereinafter, a preferred embodiment of the present invention will be described in detail with reference to the accompanying drawings.

However, the technical spirit of the present invention is not limited to some embodiments which will be described and may be embodied in various forms, and one or more elements in the embodiments may be selectively coupled and replaced to be used within the scope of the technical spirit of the present invention.

In addition, the terms used in the embodiments of the present invention (including technical and scientific terms) may be interpreted with meanings that are generally understood by those skilled in the art unless particularly defined and described, and terms which are generally used, such as terms defined in a dictionary, may be understood in consideration of their contextual meanings in the related art.

Further, the terms used in the embodiments of the present invention are provided only to describe embodiments of the present invention and not for purposes of limitation.

In the present specification, unless clearly indicated otherwise by the context, singular forms include the plural forms thereof, and in a case in which "at least one (or one or more) among A, B, and C" is described, this may include at least one combination among all combinations which may be combined with A, B, and C.

In addition, terms such as first, second, A, B, (a), (b), and the like may be used to describe elements of the embodiments of the present invention.

These terms are only provided to distinguish the elements from other elements, and the essence, sequence, order, or the like of the elements are not limited by the terms.

In addition, when an element is described as being "connected", "coupled", or "linked" to another element, the element may include not only a case of being directly connected, coupled, or linked to another element but also a case of being connected, coupled, or linked to another element by still another element between the element and another element.

Further, when an element is described as being formed "on (above)" or "under (below)" another element, the term "on (above)" or "under (below)" includes both of a case in which two elements are in direct contact with each other or a case in which one or more elements are (indirectly) disposed between two elements. In addition, when an element is described as being disposed "on or under" another element, such a description may include a case in which the element is disposed at an upper side or a lower side with respect to another element.

Figure 1:
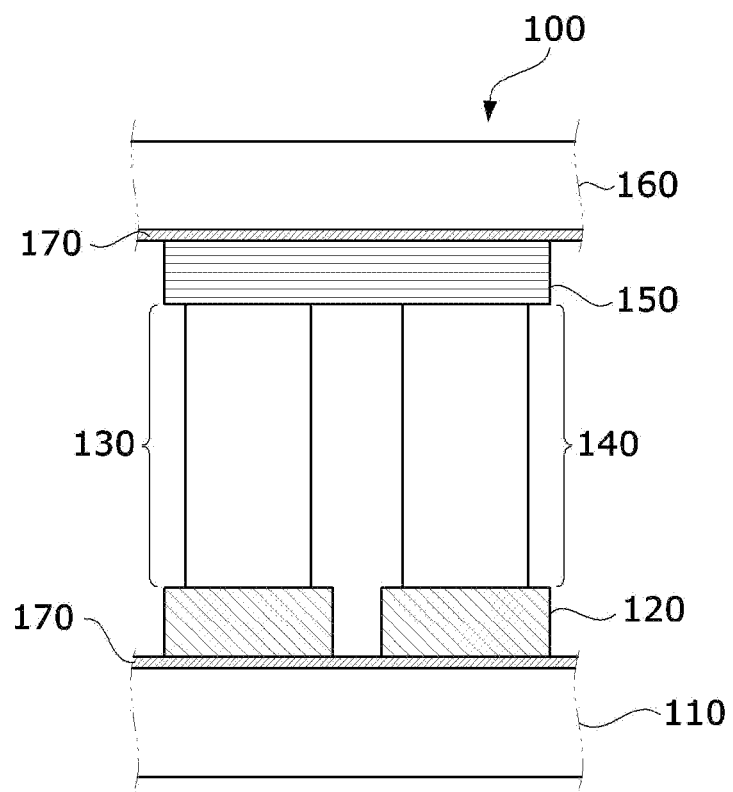
FIG. 1 is a cross-sectional view of a thermoelectric element.
Figure 2:
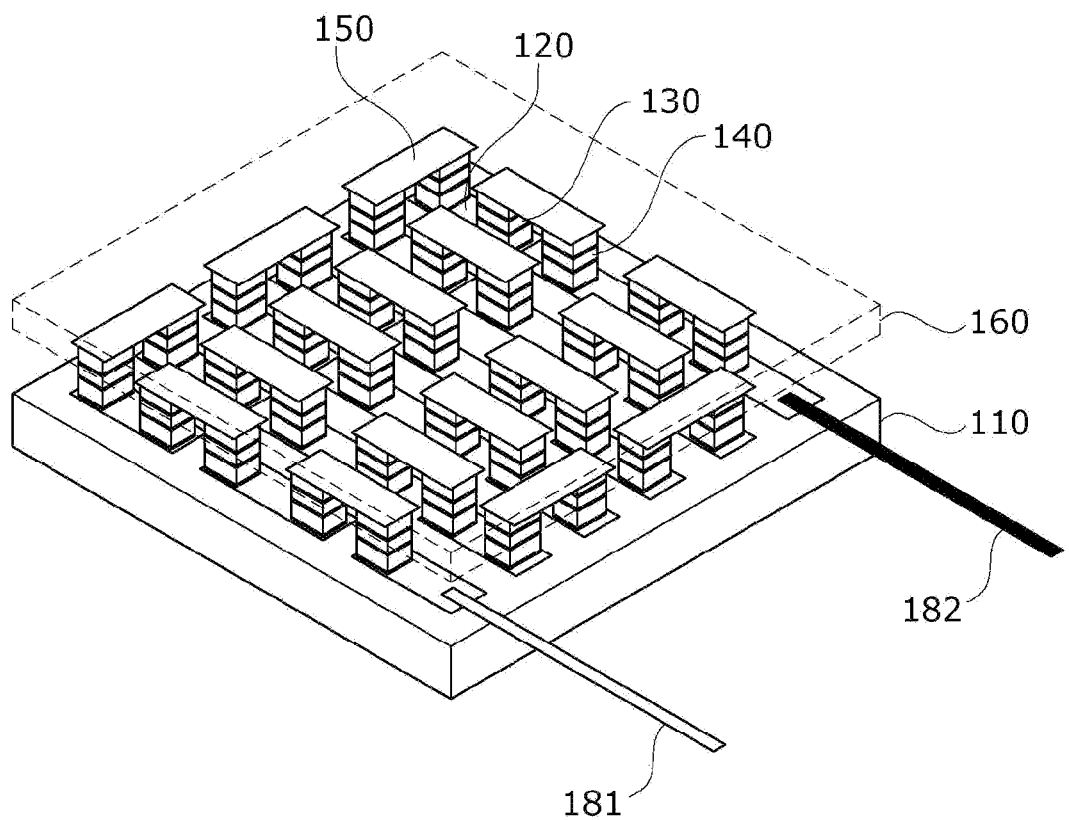
FIG. 2 is a perspective view of a thermoelectric element.
Figure 3:
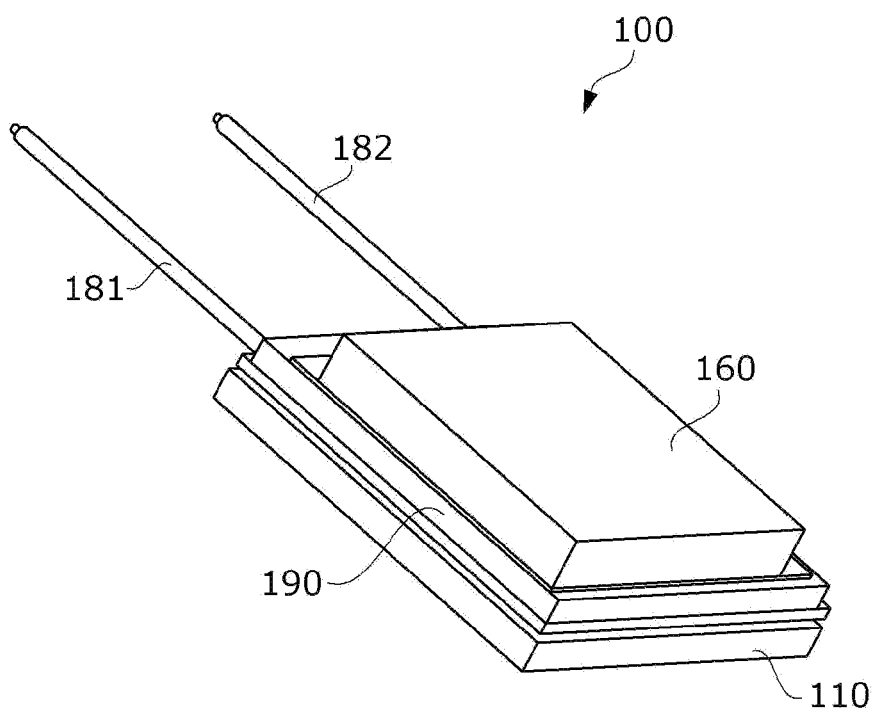
FIG. 3 is a perspective view of a thermoelectric element including a sealing member.
Figure 4:
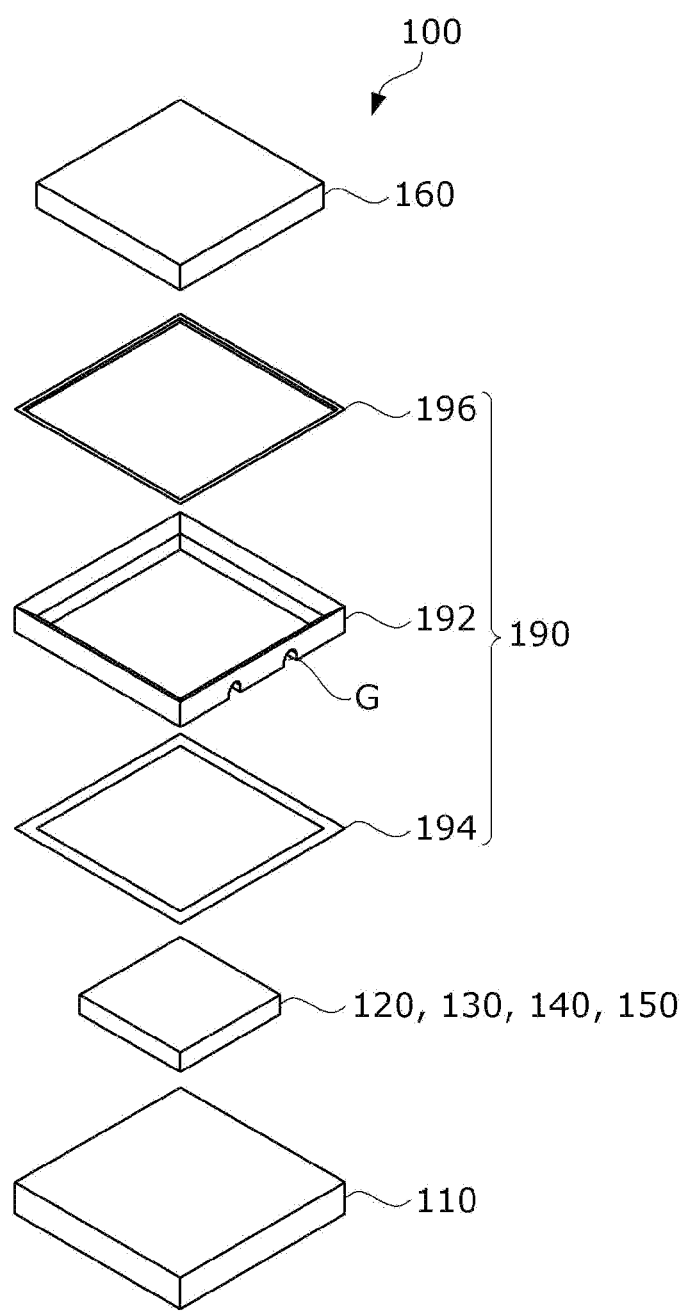
FIG. 4 is an exploded perspective view of a thermoelectric element including a sealing member.

FIG. 1 is a cross-sectional view of a thermoelectric element, FIG. 2 is a perspective view of a thermoelectric element, FIG. 3 is a perspective view of a thermoelectric element including a sealing member, and FIG. 4 is an exploded perspective view of a thermoelectric element including a sealing member.

Referring to FIGS. 1 and 2, the thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are electrically connected by the lower electrode 120 and the upper electrode 150. A pair of a P-type thermoelectric leg 130 and an N-type thermoelectric leg 140, which are disposed between the lower electrodes 120 and the upper electrodes 150 and electrically connected to each other, may form a unit cell.

For example, when a voltage is applied between the lower electrode 120 and the upper electrode 150 through lead wires 181 and 182, due to the Peltier effect, the substrate through which a current flows from the P-type thermoelectric leg 130 to the N-type thermoelectric leg 140 may absorb heat and thus serve as a cooling part, and the substrate through which a current flows from the N-type thermoelectric leg 140 to the P-type thermoelectric leg 130 may be heated and thus serve as a heating part. Alternatively, when a temperature difference is provided between the lower electrode 120 and the upper electrode 150, the charges in the P-type thermoelectric leg 130 and the N-type thermoelectric leg 140 are moved due to the Seebeck effect so that electricity may be produced.

Although lead wires 181 and 182 are illustrated as being disposed on the lower substrate 110 in FIGS. 1 to 4, it is not limited thereto, and the lead wires 181 and 182 may be disposed on the upper substrate 160, or one of the lead wires 181 and 182 may be disposed on the lower substrate 110 and the other may be disposed on the upper substrate 160.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include a Bi—Sb—Te-based main raw material in a range of 99 to 99.999 wt % and a material containing at least one among nickel (Ni), aluminum (Al), copper (Cu), silver (Ag), lead (Pb), boron (B), gallium (Ga), and indium (In) in a range of 0.001 to 1 wt %, based on a total weight of 100 wt %. The N-type thermoelectric leg 140 may be a Bi—Te-based thermoelectric leg including at least one among selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include a Bi—Se—Te-based main raw material in a range of 99 to 99.999 wt % and a material containing at least one among nickel (Ni), aluminum (Al), copper (Cu), silver (Ag), lead (Pb), boron (B), gallium (Ga), and indium (In) in a range of 0.001 to 1 wt %, based on a total weight of 100 wt %. Accordingly, the thermoelectric leg may also be referred to herein as a semiconductor structure, a semiconductor element, a semiconductor material layer, a conductive semiconductor structure, a thermoelectric structure, a thermoelectric material layer, and the like.

The P-type thermoelectric leg 130 and the N-type thermoelectric leg 140 may be formed as a bulk type or a stacked type. Generally, the bulk type P-type thermoelectric leg 130 or the bulk type N-type thermoelectric leg 140 may be obtained through a process of performing a thermal process on a thermoelectric material to manufacture an ingot, crushing and sieving the ingot to obtain a powder for a thermoelectric leg, sintering the powder, and cutting a sintered body. In this case, the P-type thermoelectric leg 130 and the N-type thermoelectric leg 140 may be polycrystalline thermoelectric legs. Thus, when the P-type thermoelectric leg 130 and the N-type thermoelectric leg 140 are polycrystalline thermoelectric legs, the strength of each of the P-type thermoelectric leg 130 and the N-type thermoelectric leg 140 may be increased. The stacked type P-type thermoelectric leg 130 or the stacked type N-type thermoelectric leg 140 may be obtained through a process of applying a sheet-shaped base with a paste including the thermoelectric material to form unit members, stacking the unit members, and cutting the stacked unit members.

In this case, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or sectional area of the N-type thermoelectric leg 140 may be formed to be different from that of the P-type thermoelectric leg 130.

Here, the P-type thermoelectric leg 130 or the N-type thermoelectric leg 140 may have a cylindrical shape, a polygonal column shape, an elliptical column shape, or the like.

Alternatively, the P-type thermoelectric leg 130 or the N-type thermoelectric leg 140 may have a stacked type structure. For example, the P-type thermoelectric leg or the N-type thermoelectric leg may be formed by a method of stacking a plurality of structures each having a sheet-shaped base coated with a semiconductor material and then cutting the plurality of structures. Accordingly, it is possible to prevent the loss of a material and improve electrical conduction properties. Each of the structures may further include a conductive layer having an opening pattern, thereby increasing adhesion between the structures, lowering thermal conductivity, and increasing electrical conductivity.

Alternatively, the P-type thermoelectric leg 130 or the N-type thermoelectric leg 140 may be formed such that sectional areas thereof are different within a single thermoelectric leg. For example, in a single thermoelectric leg, sectional areas of opposite end portions each disposed to face the electrode may be formed to be greater than a sectional area between the opposite end portions. Accordingly, a large temperature difference may be formed between the opposite end portions, and thus thermoelectric efficiency may be improved.

Performance of the thermoelectric element according to the embodiment of the present invention may be represented by a figure of merit ZT. The figure of merit ZT may be expressed by Equation 1.

$$ZT = \alpha^2 \cdot \sigma \cdot T/k \qquad \text{[Equation 1]}$$

where α is the Seebeck coefficient [V/K], σ is electrical conductivity [S/m], and $\alpha^2\sigma$ is a power factor [W/mK$^2$]. In addition, T is temperature and k is a thermal conductivity [W/mK]. k may be expressed as a·cp·ρ, wherein a is thermal diffusivity [cm$^2$/S], cp is specific heat[J/gK], and ρ is density[g/cm$^3$].

In order to obtain a figure of merit of a thermoelectric element, a Z value [V/K] is measured using a Z meter, and the figure of merit ZT may be calculated using the measured Z value.

Here, the lower electrode 120 disposed between the lower substrate 110 and the P-type thermoelectric leg 130 and the N-type thermoelectric leg 140, and the upper electrode 150 disposed between the upper substrate 160 and the P-type thermoelectric leg 130 and the N-type thermoelectric leg 140 may include at least one among copper (Cu), silver (Ag), aluminum (Al), and nickel (Ni) and have a thickness of 0.01 mm to 0.3 mm. When the thickness of the lower electrode 120 or the upper electrode 150 is less than 0.01 mm, the function thereof as an electrode decrease and thus electrical conduction performance may be degraded, and, when the thickness thereof exceeds 0.3 mm, conduction efficiency may be degraded due to an increase in resistance.

In addition, the lower substrate 110 and the upper substrate 160 facing each other may be metal substrates and may have a thickness of 0.1 mm to 1.5 mm. When the thickness of the metal substrate is less than 0.1 mm or exceeds 1.5 mm, a heat dissipation characteristic or thermal conductivity may be excessively increased so that the reliability of the thermoelectric element may be deteriorated. In addition, when the lower substrate 110 and the upper substrate 160 are metal substrates, an insulating layer 170 may be further formed between the lower substrate 110 and the lower electrodes 120 and between the upper substrate 160 and the upper electrodes 150. The insulating layer 170 may include a material having a thermal conductivity of 1 to 20 W/mK.

In this case, the lower substrate 110 and the upper substrate 160 may be formed to have different sizes. For example, a volume, a thickness, or an area of one of the lower substrate 110 and the upper substrate 160 may be formed to be greater than that of the other one thereof. Accordingly, heat absorption performance or heat dissipation performance of the thermoelectric element may be improved. For example, at least one of the volume, the thickness, or the area of one of two substrates, which is disposed in a high-temperature region for the Seebeck effect, or which is applied as a heating region for the Peltier effect, or on which a sealing member for protecting a thermoelectric module from the external environment is disposed, may be greater than that of the other substrate.

In addition, a heat dissipation pattern, for example, an irregular pattern, may be formed on a surface of at least one of the lower substrate 110 and the upper substrate 160. Accordingly, the heat dissipation performance of the thermoelectric element may be improved. In a case in which the irregular pattern is formed on a surface in contact with the P-type thermoelectric leg 130 or N-type thermoelectric leg 140, a bonding property between the thermoelectric leg and the substrate may also be improved. The thermoelectric element 100 includes the lower substrate 110, the lower electrodes 120, the P-type thermoelectric legs 130, the N-type thermoelectric legs 140, the upper electrodes 150, and the upper substrate 160.

As shown in FIGS. 3 and 4, a sealing member 190 may be further disposed between the lower substrate 110 and the upper substrate 160. The sealing member 190 may be disposed on the side surfaces of the lower electrodes 120, the P-type thermoelectric legs 130, the N-type thermoelectric legs 140, and the upper electrodes 150 between the lower substrate 110 and the upper substrate 160. Accordingly, the lower electrodes 120, the P-type thermoelectric legs 130, the N-type thermoelectric legs 140, and the upper electrodes 150 may be sealed from external moisture, heat, contamination, and the like. Here, the sealing member 190 may include a sealing case 192 disposed to be spaced apart by a predetermined distance from the outermost side of the plurality of lower electrodes 120, the outermost side of the plurality of P-type thermoelectric legs 130 and the plurality of N-type thermoelectric legs 140, and the outermost side of the plurality of upper electrodes 150, a sealing material 194 disposed between the sealing case 192 and the lower substrate 110, and a sealing material 196 disposed between the sealing case 192 and the upper substrate 160. As described above, the sealing case 192 may be in contact with the lower substrate 110 and the upper substrate 160 through the sealing materials 194 and 196. Accordingly, a problem may be prevented in which thermal conduction occurs through the sealing case 192 when the sealing case 192 is in direct contact with the lower substrate 110 and the upper substrate 160, and as a result, the temperature difference between the lower substrate 110 and the upper substrate 160 is lowered. Here, the sealing materials 194 and 196 may include at least one of an epoxy resin and a silicone resin or may include a tape having both sides on which at least one of an epoxy resin and a silicone resin is applied. The sealing materials 194 and 194 may serve to hermetically seal between the sealing case 192 and the lower substrate 110 and between the sealing case 192 and the upper substrate 160, may improve the effect of sealing the lower electrodes 120, the P-type thermoelectric legs 130, the N-type thermoelectric legs 140, and the upper electrodes 150, and may be used with a finishing material, a finishing layer, a waterproof material, a waterproof layer, and the like. Here, the sealing material 194 that seals between the sealing case 192 and the lower substrate 110 may be disposed on an upper surface of the lower substrate 110, and the sealing material 196 that seals between the sealing case 192 and the upper substrate 160 may be disposed on side surface of the upper substrate 160. Meanwhile, guide grooves G for leading the lead wires 180 and 182 connected to the electrodes may be formed in the sealing case 192. To this end, the sealing case 192 may be an injection molded product made of plastic or the like and may be used with a sealing cover. However, the above description of the sealing member is merely exemplary, and the sealing member may be modified in various forms. Although not illustrated in the drawings, a heat-insulating material may be further included to surround the sealing member. Alternatively, the sealing member may include a heat-insulating component.

Although the terms of the lower substrate 110, the lower electrode 120, the upper electrode 150, and the upper substrate 160 are used in the above, they are arbitrarily referred to as an upper side and a lower side for ease of understanding and convenience of description, and thus it is understood that the positions may be reversed such that the lower substrate 110 and the lower electrode 120 are disposed on the upper side and the upper electrode 150 and the upper substrate 160 may be disposed on the lower side.

In general, the upper substrate and the lower substrate are made of a rigid material and are disposed parallel to each other, and the upper electrode and the lower electrode are disposed to be overlapped with each other. As a result, the degree of freedom in the shape of the application to which the thermoelectric element is applied may be limited. According to an embodiment of the present invention, it is intended to obtain a thermoelectric element having an improved degree of freedom in shape by using the arrangement shape of electrodes and the structure of substrates.

Figure 5:
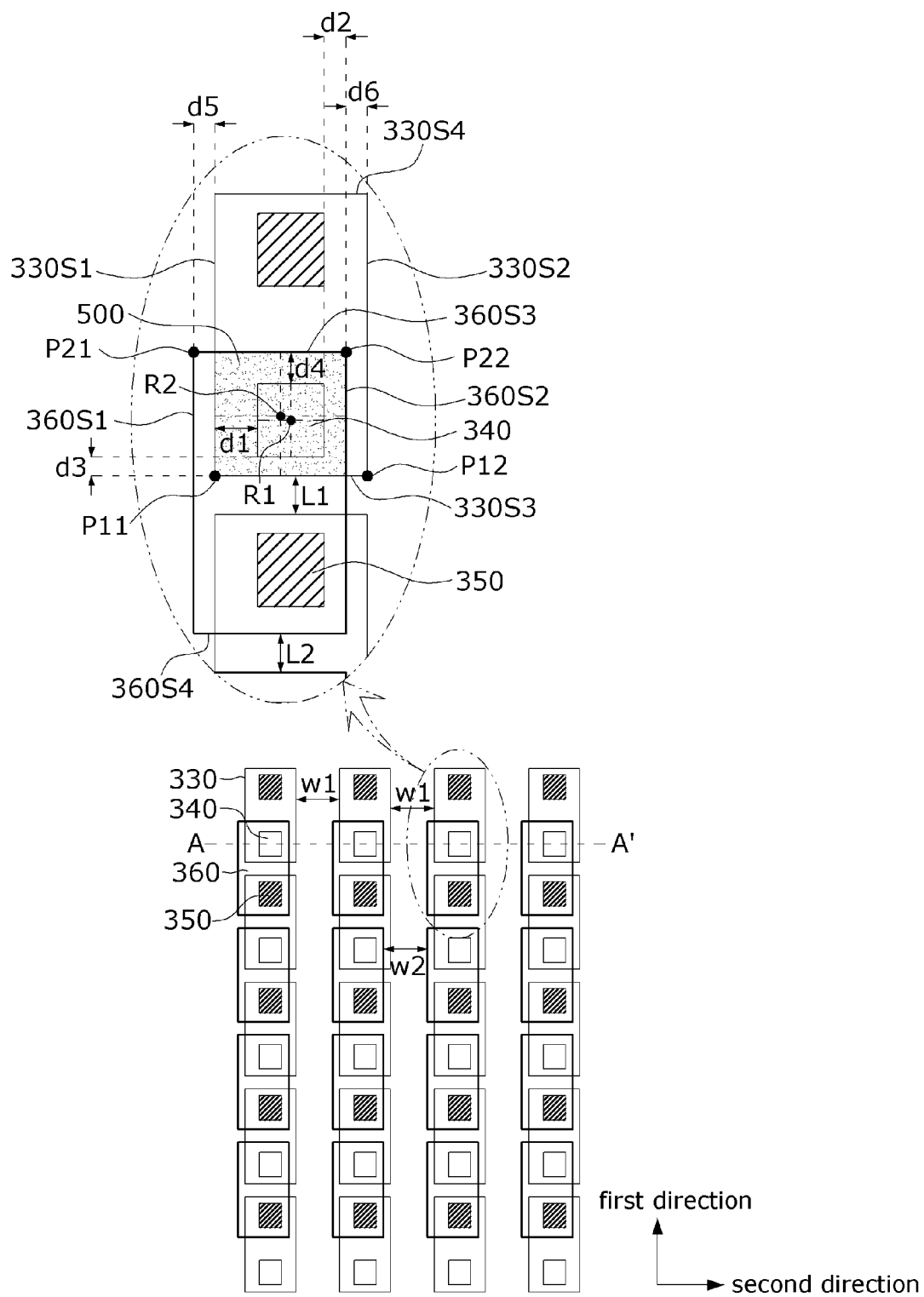
FIG. 5 is a top view illustrating an arrangement of electrodes in a thermoelectric element according to an embodiment of the present invention.
Figure 6:
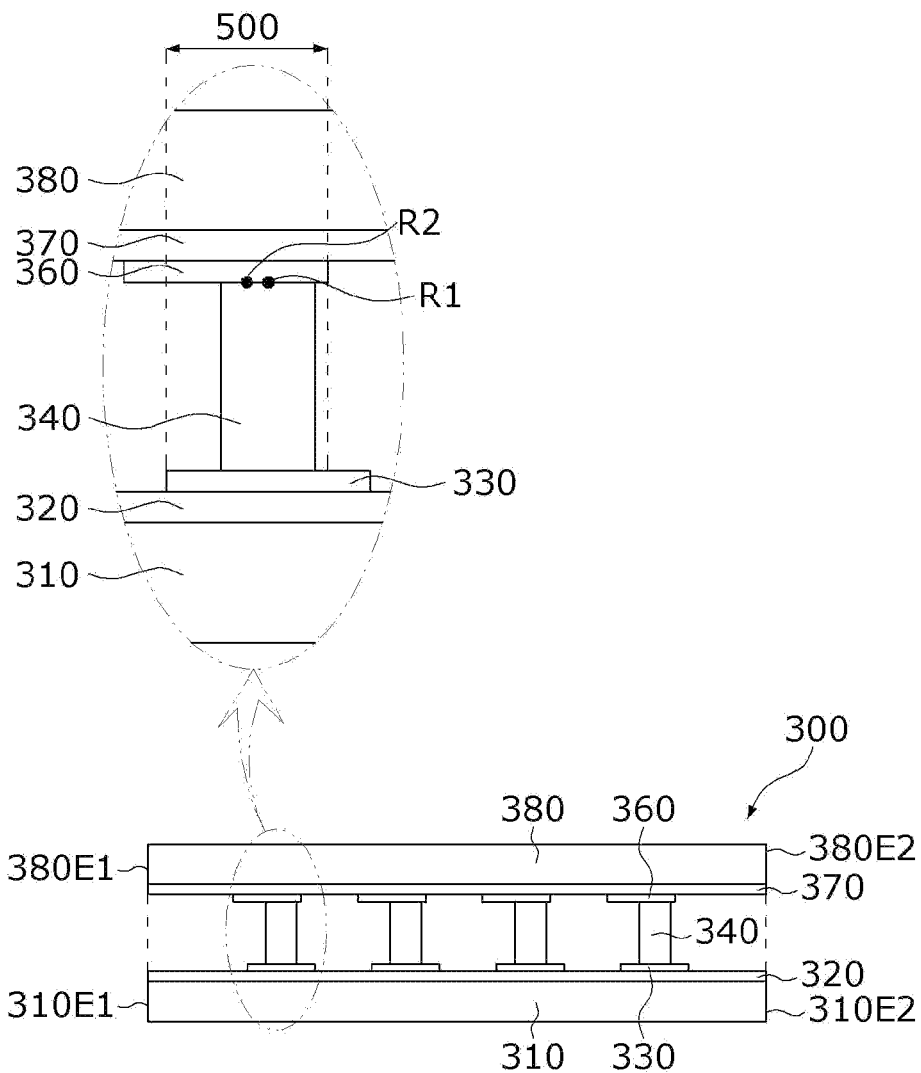
FIG. 6 is an example of a cross-sectional view taken along the direction A-A' of the thermoelectric element including the electrode arrangement of FIG. 5.
Figure 7:
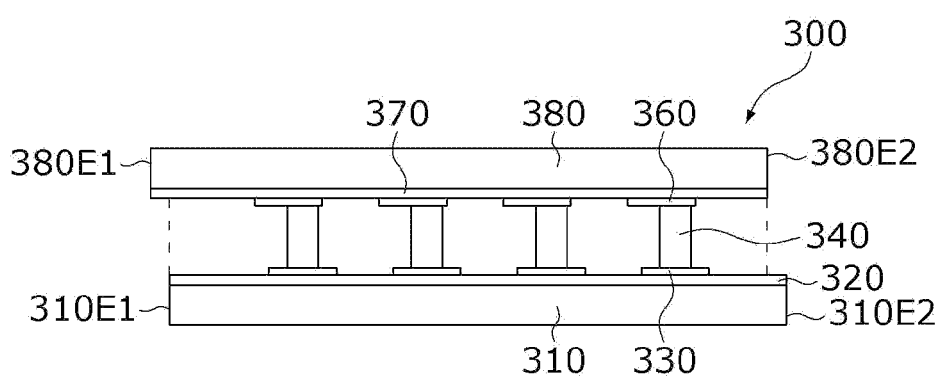
FIG. 7 is another example of a cross-sectional view taken along the direction A-A' of the thermoelectric element including the electrode arrangement of FIG. 5.

FIG. 5 is a top view illustrating the arrangement of electrodes in a thermoelectric element according to an embodiment of the present invention, FIG. 6 is an example of a cross-sectional view taken along the direction A-A' of the thermoelectric element including the electrode arrangement of FIG. 5, and FIG. 7 is another example of a cross-sectional view taken along the direction A-A' of the thermoelectric element including the electrode arrangement of FIG. 5.

Referring to FIGS. 5 to 7, a thermoelectric element 300 according to an embodiment of the present invention includes a first substrate 310, a first insulating layer 320 disposed on the first substrate 310, a first electrode array 330 disposed on the insulating layer 320, a plurality of P-type thermoelectric legs 340 and a plurality of N-type thermoelectric legs 350 disposed on the first electrode array 330, a second electrode array 360 disposed on the plurality of P-type thermoelectric legs 340 and the plurality of N-type thermoelectric legs 350, a second insulating layer 370 disposed on the second electrode array 360, and a second substrate 380 disposed on the second insulating layer 370. Although not illustrated in the drawings, a heat sink may be further disposed on the first substrate 380.

Regarding each of the first substrate 310, the first electrode part 330, the P-type thermoelectric legs 340, the N-type thermoelectric leg 350, the second electrode part 360, and the second substrate part 380, duplicate descriptions of contents which are the same as the first substrate 110, the first electrode 120, the P-type thermoelectric leg 130, the N-type thermoelectric leg 140, the second electrode 150, and the second substrate 160 illustrated in FIGS. 1 to 4 will be omitted. In addition, duplicate descriptions for the first insulating layer 320 and the second insulating layer 370 are omitted for the same contents as those of the insulating layer 170 illustrated in FIGS. 1 to 4. Although not illustrated in FIGS. 6 and 7, a sealing member may be further disposed between the first substrate 310 and the second substrate 380. Although not illustrated in FIGS. 6 and 7, a through hole through which a coupling member (not shown) passes may be formed in the first substrate 310 and the second substrate 380, and the first substrate 310 and the second substrate 380 may be coupled by a coupling member. Although not illustrated in the drawings, the first substrate may be disposed on a cooling part or a heating part. In order to fix the thermoelectric element 300 according to the embodiment of the present invention on the cooling part or the heating part, a groove or hole into which a coupling member (not shown) may be inserted may be formed in the cooling part or the heating part.

According to an embodiment of the present invention, the first electrode array 330 includes a plurality of first electrodes 330 disposed to be spaced apart from each other along a first direction and a second direction perpendicular to the first direction, and the second electrode array 360 includes a plurality of second electrodes 360 disposed to be spaced apart from each other along the first direction and the second direction perpendicular to the first direction. Here, the first direction and the second direction may be directions parallel to plane directions of the first substrate 310, the first electrode array 330, the second electrode array 360, and the second substrate 380. That is, the first direction and the second direction may be directions perpendicular to a direction from the first substrate 310 toward the second substrate 380.

In this case, the plurality of first electrodes 330 and the plurality of second electrodes 360 may each have a rectangular shape in which a length in the first direction is longer than a length in the second direction.

According to an embodiment of the present invention, the lower surface of each second electrode 360 may include an overlapping region 500 vertically overlapped with each first electrode 330, and the center R1 of the upper surface of each of the semiconductor structures 340 and 350 may be disposed so as to be offset from the center R2 of the overlapping region 500.

Here, the center R1 of the upper surface of each semiconductor structure 340 or 350 may mean a point where the center line of each semiconductor structure 340 or 350 in the first direction meets the center line of each semiconductor structure 340 or 350 in the second direction, and the center R2 of the overlapping region 500 may mean a point where the center line of the overlapping region 500 in the first direction meets the center line of the overlapping region 500 in the second direction. As a result, the degree of freedom in the shape and area of the first substrate 310 on which the first electrode 330 is disposed and the second substrate 380 on which the second electrode 360 is disposed may be increased.

That is to say, the two side surfaces 330S1 and 330S2 parallel to the first direction of each first electrode 330 are disposed so as not to vertically overlap with the two side surfaces 360S1 and 360S2 parallel to the first direction of each second electrode 360.

In this case, a first-first side surface 330S1, which is one of the two side surfaces of the first electrodes 330 parallel to the first direction, may include a region which is vertically overlapped with the second electrode 360, and a first-second side surface 330S2, which is the other one of the two side surfaces of the first electrodes 330 parallel to the first direction, may not be vertically overlapped with the second electrode 360. In addition, a second-first side surface 360S1, which is one of the two side surfaces of the second electrodes 360 parallel to the first direction, may not be vertically overlapped with the first electrode 330, and a second-second side surface 360S2, which is the other one of the two side surfaces of the second electrodes 360 parallel to the first direction, may include a region which is vertically overlapped with the first electrode 330.

In this case, a point 11 in which a first-third side surface 330S3, which is one of two side surfaces of the first electrodes 330 parallel to the second direction, meets the first-first side surface 330S1 may be vertically overlapped with the second electrode; a point 12 in which the first-third side surface 330S3 meets the first-second side surface SS0S2 may not be vertically overlapped with the second electrode 360; a point 21 in which a second-third side surface 360S3, which is one of two side surfaces of the second electrodes 360 parallel to the second direction, meets the second-first side surface 360S1 may not be vertically overlapped with the first electrode 330; and a point P22 in which the second-third side surface 360S3 meets the second-second side surface 360S2 may be vertically overlapped with the first electrode 330.

In this case, a separation distance W1 between the two first electrodes 330 disposed adjacent to each other in the second direction may be the same as a separation distance W2 between the two second electrodes disposed adjacent to each other in the second direction. Furthermore, the separation distances W1 between electrodes disposed adjacent to each other in the second direction with respect to the plurality of first electrodes 330 may be all the same, and the separation distances W2 between electrodes disposed adjacent to each other in the second direction with respect to the plurality of second electrodes 360 may all be the same.

As a result, when the first electrode 330 and the second electrode 360 are disposed to be offset from each other, the degree of freedom in the shape and area of the first substrate 310 on which the first electrode 330 is disposed and the second substrate 380 on which the second electrode 360 is disposed may be increased.

For example, as shown in FIG. 6, opposite edges 310E1 and 310E2 of the first substrate 310 and opposite edges 380E1 and 380E2 of the second substrate 380 may overlap with each other, and as shown in FIG. 7, opposite edges 310E1 and 310E2 of the first substrate 310 and opposite edges 380E1 and 380E2 of the second substrate 380 may be offset from each other. As a result, the degree of freedom of a position and shape of the cooling part or the heat dissipating part in which the thermoelectric element is disposed may be increased.

Referring back to FIG. 5, the semiconductor structure, that is, the P-type thermoelectric leg 340 and the N-type thermoelectric leg 350 may be disposed in an overlapping region between the first electrode 330 and the second electrode 360. In this case, on the basis of one of the P-type thermoelectric leg 340 and the N-type thermoelectric leg 350, for example, from the P-type thermoelectric leg 340, at least one of the shortest distance d1 to the first-first side surface 330S1, the shortest distance d2 to the second-second side surface 360S2, the shortest distance d3 to the first-third side surface 330S3, and the shortest distance d4 to the second-third side surface 360S3 may be 100 μm or more, and may be equal to or less than a width of the P-type thermoelectric leg 340 in the first direction or the second direction. For example, on the basis of the P-type thermoelectric leg 340, at least one of the shortest distance d1 to the first-first side surface 330S1, the shortest distance d2 to the second-second side surface 360S2, the shortest distance d3 to the first-third side surface 330S3 and the shortest distance d4 to the second-third side surface 360S3 may be 100 μm or more and 3 mm or less, and preferably 100 μm or more and 2 mm or less. When these numerical ranges are satisfied, the semiconductor structure may be stably aligned and soldered on the first electrode 330 and the second electrode 340, and the degree of freedom in designing the shape of the thermoelectric element 300 may be increased. Outside of the upper limit of this numerical range, the number of first electrodes, semiconductor structures, and second electrodes to be mounted per unit area may be limited. As a result, when the thermoelectric element is applied to a power generation device, the power density of generated power per unit area may be decreased, and when the thermoelectric element is applied to a cooling device, the width of the temperature drop may be reduced due to the decrease in cooling capacity per unit area.

Meanwhile, according to an embodiment of the present invention, a distance d5 between the first-first side surface 330S1 of the first electrode 330 and the second-first side surface 360S1 of the second electrode 360 in the second direction and a distance d6 between the first-second side surface 330S2 of the first electrode 330 and the second-second side surface 360S2 of the second electrode 360 in the second direction, respectively, may be 100 μm or more and 2 mm or less. When these numerical ranges are satisfied, the semiconductor structure may be stably aligned and soldered on the first electrode 330 and the second electrode 340, and the degree of freedom in designing the shape of the thermoelectric element 300 may be increased. Outside of the upper limit of this numerical range, the number of first electrodes, semiconductor structures, and second electrodes to be mounted per unit area may be limited.

Meanwhile, according to an embodiment of the present invention, a separation distance L1 between the first electrodes 330 adjacent to each other along the first direction and a separation distance L2 between the second electrodes 360 adjacent to each other along the first direction may be in the range of 50 μm or more and 2 mm or less. When the distances between the electrodes satisfy the numerical range, while the number of electrodes disposed per unit area is kept high to maximize the power generation and cooling performance per unit area, the insulation between the electrodes adjacent to each other may be maintained, and it is possible to implement a flexible substrate or a stretchable substrate.

Figure 8:
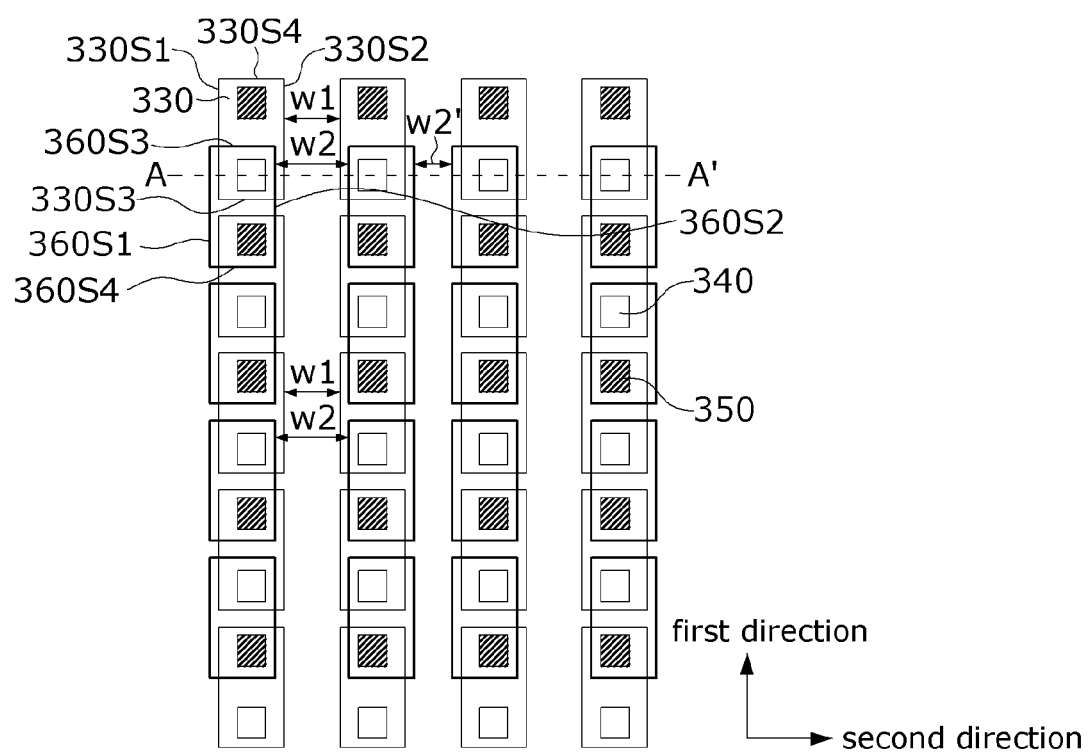
FIG. 8 is a top view illustrating the arrangement of electrodes in a thermoelectric element according to another embodiment of the present invention.
Figure 9:
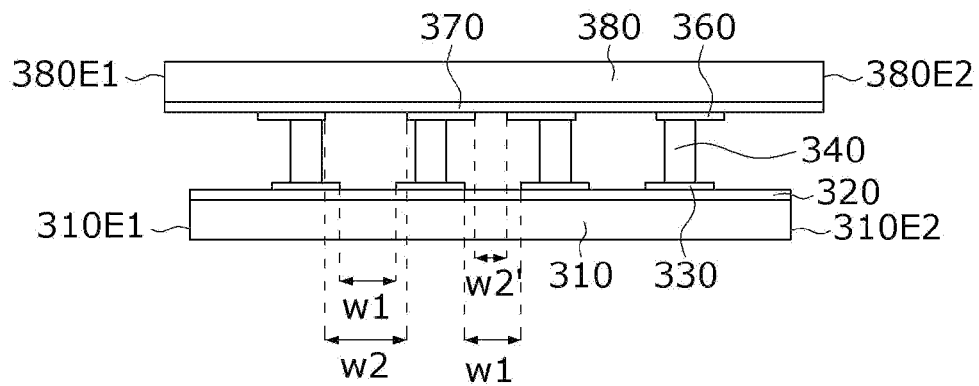
FIG. 9 is an example of a cross-sectional view of a thermoelectric element including the electrode arrangement of FIG. 9.

FIG. 8 is a top view illustrating the arrangement of electrodes in a thermoelectric element according to another embodiment of the present invention, and FIG. 9 is an example of a cross-sectional view of a thermoelectric element including the electrode arrangement of FIG. 8. Duplicate descriptions of the same contents as those described with reference to FIGS. 1 to 7 will be omitted.

Referring to FIG. 8, two side surfaces 330S1 and 330S2 of each first electrode 330 parallel to the first direction are disposed so as not to be vertically overlapped with the two side surfaces 360S1 and 360S2 of each second electrode 360 parallel to the first direction. For example, one of the two side surfaces of the first electrodes 330 parallel to the first direction includes a region which is vertically overlapped with the second electrode 360, and the other side surface may not be vertically overlapped with the second electrode 360.

In this case, the separation distance W1 between the two first electrodes 330 disposed adjacent to each other in the second direction may be different from the distance W2 between the two second electrodes 360 disposed adjacent to each other in the second direction may be different. That is, the separation distances W2 and W2' between the two second electrodes 360 disposed adjacent to each other in the second direction may be greater or smaller than the separation distance W1 between the two first electrodes 330 disposed adjacent to each other in the second direction. For example, the distance W1 between one first-first side surface 330S1 and the other first-second side surface 330S2 of two first electrodes 330 adjacent to each other in the second direction and the distances W2 and W2' between one second-first side surface 360S1 and the other second-first side surface 360S2 of two second electrodes 360 adjacent to each other in the second direction may be different from each other.

In addition, one portion W2 of the separation distance between two second electrodes 360 disposed adjacent to each other in the second direction may be different from the other portion W2' of the separation distance.

For example, one second-first side surface 360S1 and the other second-second side surface 360S2 of two adjacent second electrodes 360 in the second direction are respectively disposed on the first electrode 330 (W2), or may be disposed so as not to be overlapped with the first electrode 330 (W2').

As shown in FIG. 9, when the separation distance W2 between two second electrodes 360 adjacent in the second direction at opposite edges 380E1 and 380E2 of the second substrate 380 is disposed so as to be greater than the separation distance W1 between the two first electrodes 330 adjacent in the second direction, an area in which the plurality of second electrodes 360 are distributed on the second substrate 380 may be larger than an area in which the plurality of the first electrode 330 is distributed on the first substrate 310. Accordingly, even when the second substrate 380 having a larger area than the first substrate 310 is implemented, the plurality of second electrodes 360 may be evenly disposed throughout the second substrate 380. When the first substrate 310 is a low-temperature part and the second substrate 380 is a high-temperature part, heat dissipation performance of the second substrate 380 and thermoelectric performance of the thermoelectric element 300 may be improved if the second substrate 380 has a larger area than the first substrate 310.

Although not illustrated in the drawings, if the separation distance W2' between two second electrodes 360 adjacent to each other in the second direction at opposite edges 380E1 and 380E2 of the second substrate 380 is disposed to be smaller than the separation distance W1 between two first electrodes 330 adjacent in the second direction, an area of the first substrate 310 larger than that of the second substrate 380 may be implemented.

Figure 10:
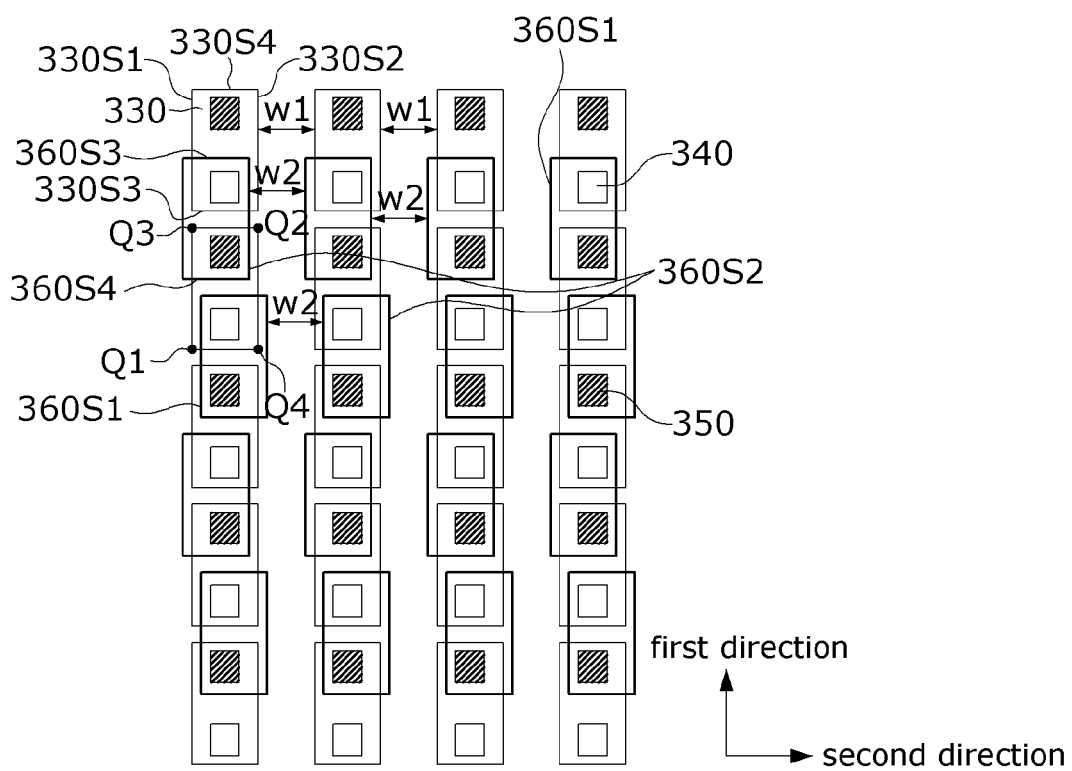
FIG. 10 is a top view illustrating the arrangement of electrodes in a thermoelectric element according to another embodiment of the present invention.
Figure 11:
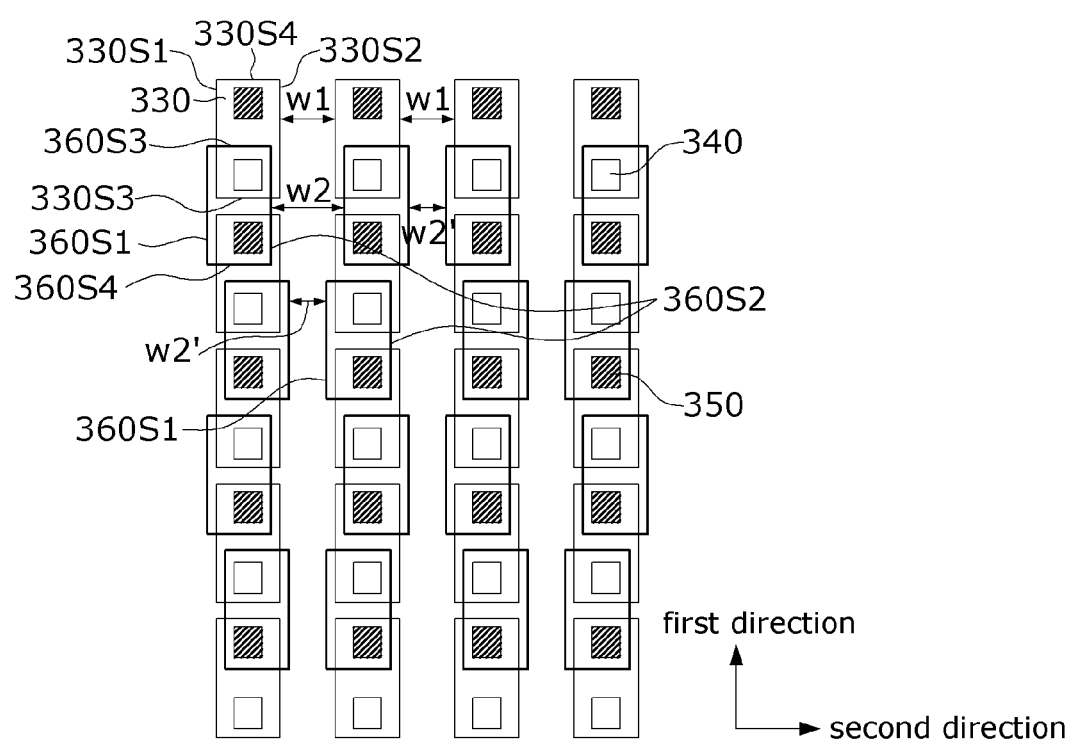
FIG. 11 is a top view illustrating the arrangement of electrodes in a thermoelectric element according to still another embodiment of the present invention.

FIG. 10 is a top view illustrating the arrangement of electrodes in a thermoelectric element according to another embodiment of the present invention, and FIG. 11 is a top view illustrating the arrangement of electrodes in a thermoelectric element according to still another embodiment of the present invention. Duplicate descriptions of the same contents as those described with reference to FIGS. 1 to 9 will be omitted.

Referring to FIGS. 10 and 11, unlike the embodiments described in FIGS. 5 to 9, a plurality of second electrodes 360 disposed so as to be spaced apart from each other along the first direction may be disposed so as to be offset from each other. For example, one second-first side surface 360S1 of the plurality of second electrodes 360 is not vertically overlapped with the first electrode 330; the second-second side surface 360S2 is disposed so as to include a region which is vertically overlapped with the first electrode 330; the second-first side surface 360S1 of the other adjacent second electrode includes a region which is vertically overlapped with the first electrode 330; and the second-second side surface 360S2 may be disposed so as not to be vertically overlapped with the first electrode 330. Accordingly, each of the first side surface 330S1 and the second side surface 330S2 of each first electrode 330 may include a region overlapped with the second electrode 360 and a region non-overlapped with the second electrode 360. That is, each first electrode 330 may include a first region which is vertically overlapped with one second electrode among the plurality of second electrodes 360 and a second region which is vertically overlapped with the second electrode adjacent in the first direction. In this case, in each first electrode 330, a point Q1 in which the first-first side surface 330S1 meets the first-third side surface 330S3 and a point Q2 in which the first-second side surface 330S2 meets the first-fourth side surface 330S4 may not be vertically overlapped with the plurality of second electrodes 360, a point Q3 where the first-first side surface 330S1 meets the first-fourth side surface 330S4 may be vertically overlapped with one of the plurality of second electrodes 360, and a point Q4 where the first-second side surfaces 330S2 meets the first-third side surface 330S3 may be vertically overlapped with the other one of the plurality of second electrodes 360.

In this case, as shown in FIG. 10, a separation distance W1 between two first electrodes 330 disposed adjacent to each other in the second direction and a separation distance W2 between two second electrodes disposed adjacent to each other in the second direction may be the same. In addition, in the plurality of first electrodes 330, the separation distances W1 between electrodes disposed adjacent to each other in the second direction are the same, and the plurality of second electrodes 360, the separation distances W2 between electrodes disposed adjacent to each other in the second direction may all be the same.

Alternatively, as shown in FIG. 11, the separation distance W1 between two first electrodes 330 disposed adjacent to each other in the second direction may be different from the separation distance W2 between two second electrodes 360 disposed adjacent to each other in the second direction. That is, the separation distances W2 and W2' between the two second electrodes 360 disposed adjacent to each other in the second direction may be greater or smaller than the separation distance W1 between the two first electrodes 330 disposed adjacent to each other in the second direction.

In addition, one portion W2 of the separation distance between two second electrodes 360 disposed adjacent to each other in the second direction may be different from the other portion W2'.

As a result, when the first electrode 330 and the second electrode 360 are disposed to be offset from each other, in the first substrate 310 on which the first electrode 330 is disposed and the second substrate 380 on which the second electrode 360 is disposed, the degree of freedom of the shape and area of the first and second substrates 310 and 360 may be increased.

In the embodiments of FIGS. 5 to 11, the first substrate 310 and the second substrate 380 may include at least one of aluminum, an aluminum alloy, copper, and a copper alloy. In this case, when a voltage is applied to the thermoelectric element, the first substrate 310 absorbs heat according to the Peltier effect and acts as a low-temperature part, and the second substrate 380 emits heat and acts as a high-temperature part. Meanwhile, when different temperatures are applied to the first substrate 310 and the second substrate 380, a thermo-electromotive force is generated while electrons in a high-temperature region move to a low-temperature region due to a difference in the temperature. This is referred to as the Seebeck effect, and electricity may be generated in the circuit of the thermoelectric element by the resulting thermo-electromotive force.

Alternatively, at least one of the first substrate 310 and the second substrate 380 may include a flexible element or a stretchable element. When at least one of the first substrate 310 and the second substrate 380 includes a flexible material or a stretchable material, a flexible thermoelectric element or a stretchable thermoelectric element may be implemented using the electrode arrangement according to the embodiments of FIGS. 5 to 11, and a thermoelectric element applicable to curved surfaces may be obtained.

Alternatively, while the first substrate 310 and the second substrate 380 are rigid substrates, a flexible substrate or a stretchable substrate may be implemented by cutting a portion of the substrates.

In this specification, the term 'flexible' may mean flexible properties that are unbreakable, bendable, rollable, foldable, and bendable. In this specification, the term 'stretchable' may mean a property of being stretched or reduced.

Figure 12:
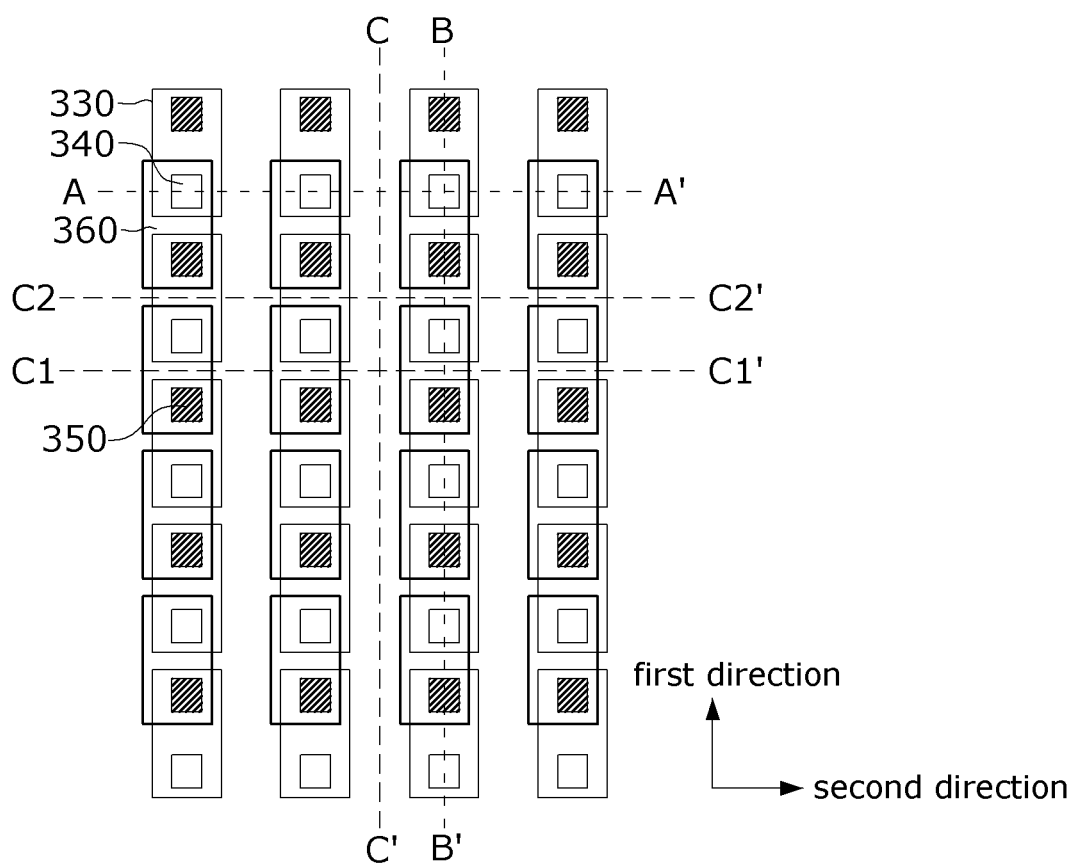
FIG. 12 illustrates an electrode arrangement in a thermoelectric element and cutting directions of substrates according to an embodiment of the present invention.
Figure 13:
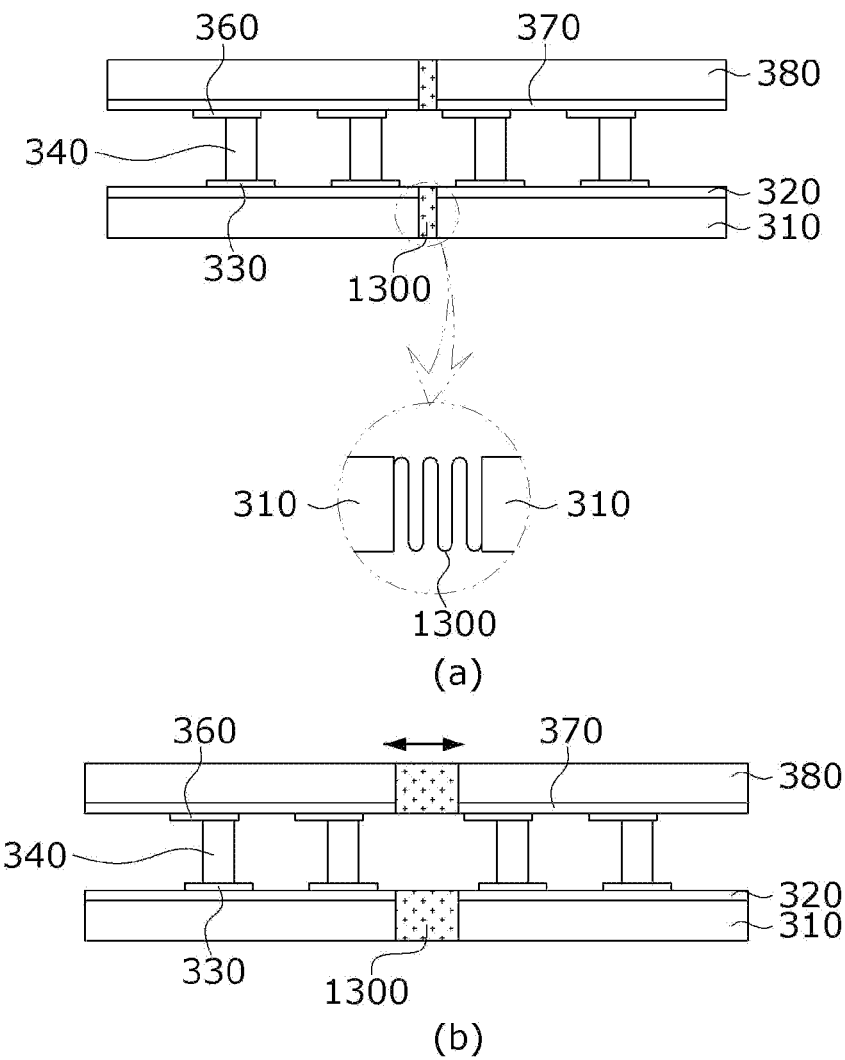
FIG. 13 (a) and (b) are cross-sectional views taken along the direction A-A' when a first substrate and a second substrate are cut along the direction C-C' in the electrode arrangement of FIG. 12.
Figure 14:
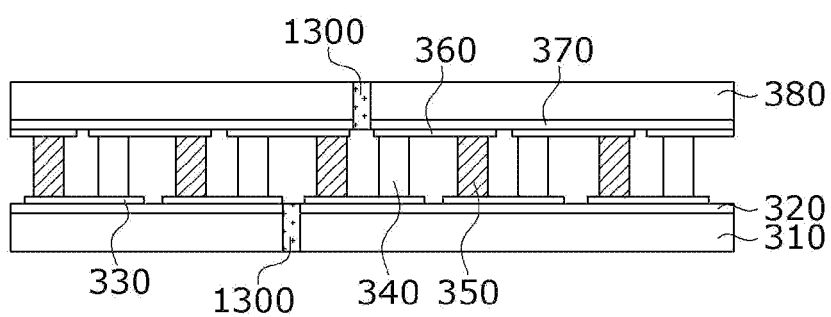
FIG. 14 is a cross-sectional view taken along the direction B-B' when a first substrate is cut along the direction C1-C1' and a second substrate is cut along the direction C2-C2' in the electrode arrangement of FIG. 12.

FIG. 12 illustrates an electrode arrangement in a thermoelectric element and cutting directions of substrates according to an embodiment of the present invention, FIG. 13 is a cross-sectional view taken along the direction A-A' when a first substrate and a second substrate are cut along the direction C-C' in the electrode arrangement of FIG. 12, and FIG. 14 is a cross-sectional view taken along the direction B-B' when a first substrate is cut along the direction C1-C1' and a second substrate is cut along the direction C2-C2' in the electrode arrangement of FIG. 12;

Referring to FIGS. 12 and 13, the first substrate 310 may be cut parallel to at least one of two side surfaces of the first electrodes 330 parallel to the first direction, and the second substrate 380 may be cut parallel to at least one of two side surfaces of the second electrodes 360 parallel to the first direction. Accordingly, the first substrate 310 may include a disconnection region extending in a direction parallel to at least one of two side surfaces of the first electrodes 330 parallel to the first direction, and the second substrate 380 may include a disconnection region extending in parallel to at least one of two side surfaces of the second electrodes 360 parallel to the first direction. An elastic layer 1300 may be disposed in the disconnection region of the first substrate 310 and the disconnection region of the second substrate 380. The elastic layer 1300 may include an elastic material that may be bent by an external force or stretched in at least one direction by an external force. For example, the elastic layer 1300 may include at least one of polyurethane (PU), polydimethylsiloxane (PDMS), and polyimide (PI). The elastic layer 1300 may be disposed to fill the disconnection region of the first substrate 310 and the disconnection region of the second substrate 380, or may be in the form of a folded film within the disconnection region of the first substrate 310 and the disconnection region of the second substrate 380, as shown in the enlarged view of FIG. 13. Accordingly, even when the first substrate 310 and the second substrate 380 are rigid substrates, they may be flexibly bent through the elastic layer 1300. In this specification, the disconnection region may be referred to as a separated region, a cut region, or an elastic region. In this specification, the disconnection region refers to a region filled with a material other than the main material (e.g., metal) constituting the substrate. The disconnection region may be formed by cutting one substrate along a first direction to divide it into two substrates and then filling a space between the two divided substrates with an elastic layer, or may be formed by a method of filling the space between the separated region with an elastic layer after disposing the two previously divided substrates in parallel so that they are spaced apart at a predetermined interval.

In this case, as shown in FIG. 13(a), the disconnection region of the first substrate 310 and the disconnection region of the second substrate 380 may be vertically overlapped with each other. Accordingly, even when the first substrate 310 and the second substrate 380 are rigid substrates, as shown in FIG. 13(b), they may be stretched by an external force through the elastic layer 1300.

Referring to FIGS. 12 and 14, the first substrate 310 may be cut parallel to at least one of two side surfaces of the first electrodes 330 parallel to the second direction, and the second substrate 380 may be cut parallel to at least one of two side surfaces of the second electrodes 360 parallel to the second direction. Similar to the embodiment of FIG. 13, the elastic layer 1300 may be disposed in the disconnection region of the first substrate 310 and the disconnection region of the second substrate 380. Accordingly, even when the first substrate 310 and the second substrate 380 are rigid substrates, they may be flexibly bent through the elastic layer 1300. In this case, the disconnection region of the first substrate 310 and the disconnection region of the second substrate 380 may not be vertically overlapped with each other, as shown in FIG. 14. A cutting direction and cutting position of the first substrate 310 and the second substrate 320 may be variously modified according to the shape of the surface to which the thermoelectric element is applied.

Figure 15:
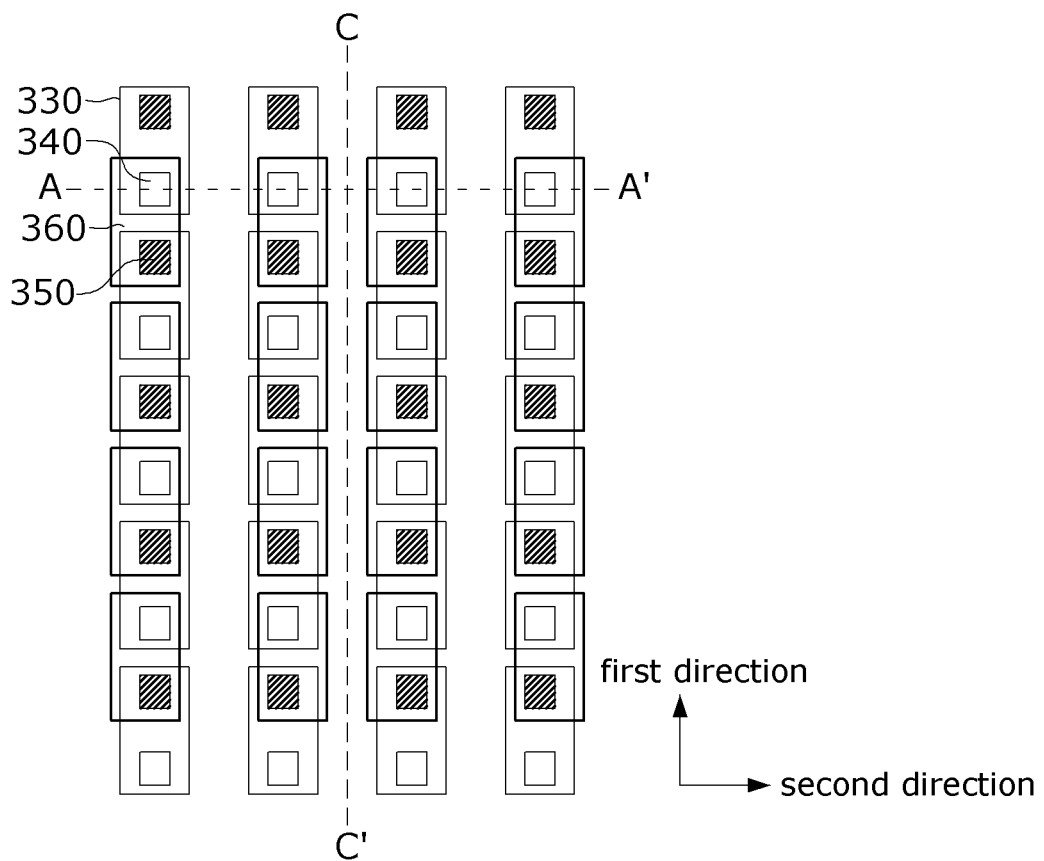
FIG. 15 illustrates an electrode arrangement in a thermoelectric element and cutting directions of substrates according to another embodiment of the present invention.
Figure 16:
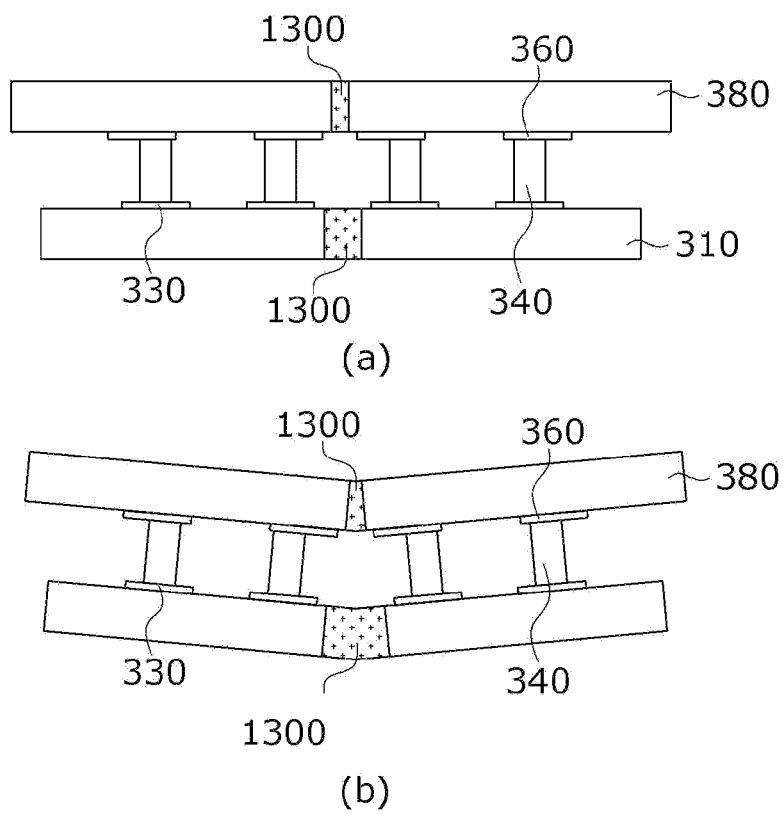
FIG. 16 (a) and (b) are cross-sectional views taken along the direction A-A' when a first substrate and a second substrate are cut along the direction C-C' in the electrode arrangement of FIG. 15.

FIG. 15 illustrates an electrode arrangement in a thermoelectric element and cutting directions of substrates according to another embodiment of the present invention; and FIG. 16 is a cross-sectional view taken along the direction A-A' when the first substrate and the second substrate are cut along the direction C-C' in the electrode arrangement of FIG. 15.

Referring to FIGS. 15 and 16, the first substrate 310 may be cut parallel to at least one of two side surfaces parallel to the first direction of the first electrodes 330, and the second substrate 380 may be cut parallel to at least one of two side surfaces parallel to the first direction of the second electrodes 360. In this case, the elastic layer 1300 may be disposed in the disconnection region of the first substrate 310 and the disconnection region of the second substrate 380. When the electrode arrangement structure is the same as the embodiment of FIG. 8, that is, when a separation distance between two first electrodes adjacent to each other in the second direction and a separation distance between two second electrodes adjacent to each other in the second direction are different from each other, a width of the disconnection region of the first substrate 310 in the second direction may be different from a width of the disconnection region of the second substrate 380 in the second direction, as shown in FIG. 16 (a). Accordingly, even when the first substrate 310 and the second substrate 380 are rigid substrates, as shown in FIG. 16(b), they may not only be stretched by an external force, but also may be bent at a large angle, through the elastic layer 1300.

Although not illustrated in the drawings, when the thermoelectric element according to the embodiment of the present invention is applied to a power generation device using Seebeck effect, the thermoelectric element may be coupled to a first fluid flow part and a second fluid flow part. The first fluid flow part may be disposed on one of the first and second substrates of the thermoelectric element, and the second fluid flow part may be disposed on the other one of the first and second substrates of the thermoelectric element. A flow path may be formed in at least one of the first fluid flow part and the second fluid flow part so that at least one of the first fluid and the second fluid flows, and in some cases, at least one of the first fluid flow part and the second fluid flow part may be omitted, and at least one of the first fluid and the second fluid may directly flow to the substrate of the thermoelectric element. For example, the first fluid may flow adjacent to one of the first substrate and the second substrate, and the second fluid may flow adjacent to the other substrate. In this case, a temperature of the second fluid may be higher than a temperature of the first fluid. Accordingly, the first fluid flow part may be referred to as a cooling part. As another embodiment, the temperature of the first fluid may be higher than the temperature of the second fluid. Accordingly, the second fluid flow part may be referred to as a cooling part. A heat sink 390 may be connected to a substrate on which a fluid having a higher temperature flows among the first fluid flow part and the second fluid flow part. The absolute value of the temperature difference between the first fluid and the second fluid may be 40° C. or more, preferably 70° C. or more, more preferably 95° C. to 185° C.

When the thermoelectric element or thermoelectric module according to an embodiment of the present invention is used in a transportation mechanism such as a ship or an automobile, power may be generated using waste heat discharged from an exhaust side of an engine, and the generated energy is stored in a battery of the transportation mechanism so that it may be supplied to various devices in the transportation mechanism, such as lighting and gas circulation devices. When the thermoelectric element according to an embodiment of the present invention is disposed on an intake side of an engine, the thermoelectric element according to an embodiment of the present invention may be used as a temperature control device as well as a power generation device. When the thermoelectric element according to the embodiment of the present invention is used as a temperature control device, fuel efficiency of the engine may be improved by increasing the amount of gas injected into the engine by lowering the temperature of the gas injected into the engine. Accordingly, the engine in the transportation mechanism and the thermoelectric element according to the embodiments of the present invention influence each other, and may have functional integrity or technical interoperability. In addition, in the shipping industry and transportation industry using transportation mechanism to which the thermoelectric element according to the embodiment of the present invention is applied, transportation costs may be reduced and an eco-friendly industrial environment may be created due to the thermoelectric element according to the embodiment of the present invention, so that it is possible to achieve functional integrity or technical interoperability with the thermoelectric element according to the present invention.

When the thermoelectric element according to the embodiment of the present invention is used in a power plant, it is possible to adjust the efficiency of the used fuel compared to the energy produced by using the heat generated in the power plant, thereby adjusting the energy production cost and the eco-friendly industrial environment, so that the power plant and the thermoelectric element according to the embodiment of the present invention may achieve functional integrity or technical interoperability.

When the thermoelectric element according to the embodiment of the present invention is used in a plant such as a steel mill, energy consumption may be reduced by producing energy through power generation using waste heat generated in the plant, and when it may be used as a temperature control device, temperature in the manufacturing stage of the product or in the plant may be controlled to affect other components of the plant, so that the thermoelectric element according to the embodiment of the present invention and the other components of the plant may achieve functional integrity or technical interoperability.

The thermoelectric element according to an embodiment of the present invention may be used as a small power supply device for supplying energy to a temperature sensor or a sensor of a wireless network. That is, it is possible to achieve permanent energy supply to a sensor, etc., and when used as a temperature sensor installed underground or a power supply device for a temperature sensor, functional integrity or technical interoperability with a wireless network system may be achieved.

The thermoelectric element according to the embodiment of the present invention may be used as a temperature control device, and when used in an electric vehicle, battery charging device, and the like, the temperature of the electric vehicle or battery charging device may be controlled, so that functional integrity or technical interoperability may be achieved through functions such as enhancing the stability of the electric vehicle or the battery charging device.

Although the preferred embodiments of the present invention have been described above, it may be understood by those skilled in the art that a variety of modifications and changes may be made without departing from the concept and scope of the present invention disclosed within the range of the following claims.

What is claimed is:

1. A thermoelectric element comprising:
  a first electrode;
  a semiconductor structure disposed on the first electrode; and
  a second electrode disposed on the semiconductor structure,
  wherein a lower surface of the second electrode includes an overlapping region which is vertically overlapped with the first electrode,
  wherein the semiconductor structure includes an upper surface facing the second electrode,
  wherein a center of the upper surface of the semiconductor structure is disposed to be offset from a center of the overlapping region,
  wherein each of the first electrode and the second electrode has a length in which a length in a first direction perpendicular to a direction from the first electrode toward the second electrode is longer than a length in a second direction perpendicular to the direction from the first electrode toward the second electrode and the first direction,
  each of two side surfaces of the first electrode parallel to the first direction is disposed to be not vertically overlapped with each of two side surfaces of the second electrode parallel to the first direction,
  wherein a first-first side surface, which is one of the two side surfaces of the first electrode parallel to the first direction, includes a region which is vertically overlapped with the second electrode, and a first-second side surface, which is the other side surface, is not vertically overlapped with the second electrode,
  a second-first side surface, which is one of the two side surfaces of the second electrode parallel to the first direction, is not vertically overlapped with the first electrode, and a second-second side surface, which is the other side surface, includes a region which is vertically overlapped with the first electrode,
  wherein a point where a first-third side surface, which is one of two side surfaces of the first electrode parallel to the second direction, meets the first-first side surface is vertically overlapped with the second electrode, and a point where the first-third side surface meets the first-second side surface is not vertically overlapped with the second electrode,
  a point where a second-third side surface, which is one of two side surfaces of the second electrode parallel to the second direction, meets the second-first side surface is not vertically overlapped with the first electrode, and a point where the second-third side surface meets the second-second side surface is vertically overlapped with the first electrode, and
  wherein at least one of the shortest distance between the semiconductor structure and the first-first side surface, the shortest distance between the semiconductor structure and the second-second side surface, the shortest distance between the semiconductor structure and the first-third side surface of the first electrode and the shortest distance between the semiconductor structure and the second-third side surface is 100 µm or more, and is less than or equal to a width of the semiconductor structure in the first direction or the second direction.

2. The thermoelectric element of claim 1, further comprising:
  a first substrate disposed on a lower surface of the first electrode; and
  a second substrate disposed on an upper surface of the second electrode,
  wherein the first substrate includes a disconnection region extending parallel to at least one of two side surfaces of the first electrode parallel to the first direction, the second substrate includes a disconnection region extending parallel to at least one of the two side surfaces of the second electrode parallel to the first direction, and at least a portion of the disconnection region of the first substrate and the disconnection region of the second substrate is vertically overlapped.

3. The thermoelectric element of claim 2, wherein a width of the disconnection region of the first substrate in the second direction is different from a width of the disconnection region of the second substrate in the second direction.

4. The thermoelectric element of claim 1, further comprising:
  a first substrate disposed on a lower surface of the first electrode; and
  a second substrate disposed on an upper surface of the second electrode,
  wherein the first substrate includes a disconnection region extending parallel to at least one of two side surfaces of the first electrode parallel to the second direction, the second substrate includes a disconnection region extending parallel to at least one of the two side surfaces of the second electrode parallel to the second direction, and the disconnection region of the first substrate is not be vertically overlapped with the disconnection region of the second substrate.

5. The thermoelectric element of claim 1, further comprising: a first substrate disposed on a lower surface of the first electrode,
  wherein the first substrate is cut parallel to at least one of two side surfaces of the first electrode parallel to the first direction or to at least one of two side surfaces of the first electrode parallel to the second direction.

6. The thermoelectric element of claim 1, further comprising: a second substrate disposed on an upper surface of the second electrode,
  wherein the second substrate is cut parallel to at least one of two side surfaces of the second electrode parallel to the first direction or to at least one of two side surfaces of the second electrode parallel to the second direction.

7. A thermoelectric element comprising:

a first electrode;

a semiconductor structure disposed on the first electrode; and a second electrode disposed on the semiconductor structure, wherein a lower surface of the second electrode includes an overlapping region which is vertically overlapped with the first electrode, wherein the semiconductor structure includes an upper surface facing the second electrode, wherein a center of the upper surface of the semiconductor structure is disposed to be offset from a center of the overlapping region, wherein each of the first electrode and the second electrode has a length in which a length in a first direction perpendicular to a direction from the first electrode toward the second electrode is longer than a length in a second direction perpendicular to the direction from the first electrode toward the second electrode and the first direction, each of two side surfaces of the first electrode parallel to the first direction is disposed to be not vertically overlapped with each of two side surfaces of the second electrode parallel to the first direction, wherein a first-first side surface, which is one of the two side surfaces of the first electrode parallel to the first direction, includes a region which is vertically overlapped with the second electrode, and a first-second side surface, which is the other side surface, is not vertically overlapped with the second electrode, a second-first side surface, which is one of the two side surfaces of the second electrode parallel to the first direction, is not vertically overlapped with the first electrode, and a second-second side surface, which is the other side surface, includes a region which is vertically overlapped with the first electrode, wherein a point where a first-third side surface, which is one of two side surfaces of the first electrode parallel to the second direction, meets the first-first side surface is vertically overlapped with the second electrode, and a point where the first-third side surface meets the first-second side surface is not vertically overlapped with the second electrode, a point where a second-third side surface, which is one of two side surfaces of the second electrode parallel to the second direction, meets the second-first side surface is not vertically overlapped with the first electrode, and a point where the second-third side surface meets the second-second side surface is vertically overlapped with the first electrode, and wherein at least one of a distance between the first-first side surface and the second-first side surface in the second direction and a distance between the first-second side surface and the second-second side surface in the second direction is 100 μm or more and 2 mm or less.

8. A thermoelectric element comprising:

a first electrode;

a semiconductor structure disposed on the first electrode;

a second electrode disposed on the semiconductor structure;

a first substrate disposed on a lower surface of the first electrode; and a second substrate disposed on an upper surface of the second electrode, wherein a lower surface of the second electrode includes an overlapping region which is vertically overlapped with the first electrode, wherein the semiconductor structure includes an upper surface facing the second electrode, wherein a center of the upper surface of the semiconductor structure is disposed to be offset from a center of the overlapping region, wherein each of the first electrode and the second electrode has a length in which a length in a first direction perpendicular to a direction from the first electrode toward the second electrode is longer than a length in a second direction perpendicular to the direction from the first electrode toward the second electrode and the first direction, each of two side surfaces of the first electrode parallel to the first direction is disposed to be not vertically overlapped with each of two side surfaces of the second electrode parallel to the first direction, wherein the first substrate includes a disconnection region extending parallel to at least one of two side surfaces of the first electrode parallel to the first direction, the second substrate includes a disconnection region extending parallel to at least one of the two side surfaces of the second electrode parallel to the first direction, and at least a portion of the disconnection region of the first substrate and the disconnection region of the second substrate is vertically overlapped, and wherein an elastic layer is disposed on at least one of the disconnection region of the first substrate and the disconnection region of the second substrate.

* * * * *